United States Patent
Xu et al.

(10) Patent No.: US 9,786,489 B1
(45) Date of Patent: Oct. 10, 2017

(54) METHOD OF CLEANING POST-ETCH RESIDUES ON A COPPER LINE

(71) Applicant: UNITED MICROELECTRONICS CORP., Hsin-Chu (TW)

(72) Inventors: Ming Sheng Xu, Singapore (SG); Ching-Long Tsai, Singapore (SG); Hua-Kuo Lee, Taipei (TW); Guangjun Huang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/461,486

(22) Filed: Mar. 17, 2017

(51) Int. Cl.
| | | |
|---|---|---|
| *H01L 21/00* | (2006.01) | |
| *H01L 21/02* | (2006.01) | |
| *H01L 21/768* | (2006.01) | |
| *H01L 21/311* | (2006.01) | |

(52) U.S. Cl.
CPC .. *H01L 21/02063* (2013.01); *H01L 21/31116* (2013.01); *H01L 21/76807* (2013.01); *H01L 2224/45147* (2013.01); *H01L 2924/01029* (2013.01)

(58) Field of Classification Search
CPC ..... H01L 21/02063; H01L 2924/01029; H01L 2224/45147
See application file for complete search history.

(56) References Cited

U.S. PATENT DOCUMENTS

| | | | | |
|---|---|---|---|---|
| 2004/0134873 | A1* | 7/2004 | Yao | C09G 1/02 216/2 |
| 2009/0221143 | A1* | 9/2009 | Saga | H01L 21/02063 438/666 |
| 2010/0055897 | A1* | 3/2010 | Chou | C11D 3/3947 438/638 |
| 2012/0009788 | A1* | 1/2012 | Liu | C11D 7/08 438/675 |
| 2013/0217234 | A1* | 8/2013 | Liu | C11D 7/34 438/702 |
| 2013/0296214 | A1* | 11/2013 | Barnes | H01L 21/02063 510/176 |
| 2016/0189966 | A1* | 6/2016 | Kolics | H01L 21/288 438/678 |
| 2016/0272924 | A1* | 9/2016 | Kajikawa | H01L 21/02074 |
| 2016/0300730 | A1* | 10/2016 | Wu | H01L 21/02074 |
| 2017/0092479 | A9* | 3/2017 | Cui | H01L 21/0206 |

* cited by examiner

*Primary Examiner* — Ngan Ngo
(74) *Attorney, Agent, or Firm* — Winston Hsu

(57) ABSTRACT

A method of cleaning post-etch residues on a copper line includes providing a copper line which is divided into a first region and a second region. A dielectric layer is formed on the copper line. After that, the dielectric layer is etched to form openings in the dielectric layer. A number of openings within the first region is more than a number of openings in the second region. During the etching process, a potential difference is formed between the first region and the second region of the copper line. Finally, the dielectric layer and the copper line are cleaned by a solution with a PH value. The PH value has a special relation with the potential difference.

4 Claims, 3 Drawing Sheets

METHOD OF CLEANING POST-ETCH RESIDUES ON A COPPER LINE

BACKGROUND OF THE INVENTION

1. Field of the Invention

The present invention relates to a method of cleaning post-etch residues on a copper line, and more particularly to a method of cleaning post-etch residues using a solution which does not corrode the copper line.

2. Description of the Prior Art

A dual damascene process is a method of forming metallic interconnects, involving the etching of an opening in a dielectric layer followed by re-filling the opening with a metallic layer. Dual damascene process not only has the advantage of being a low-cost and highly reliable method of forming interconnects, but the type of material used for re-filling the opening is also unrestricted by the etching process. Hence, the technique is now widely adopted in the formation of copper lines for reducing conductive line resistance and increasing the operating speed of devices. As the demand for higher operating speed semiconductor products increases, more integrated circuits are being fabricated by the dual damascene process using a low dielectric constant material.

The opening in the dielectric layer is usually achieved by a dry etching process; however, during the etching process, post-etch residues may be formed on the dielectric layer. A conventional post-etch residues clean process generally involves the use of an aqueous solution. During the post-etch residues clean process, corrosion can lead to pitting and openings in the copper line, which can adversely affect the electrical properties of the semiconductor device.

SUMMARY OF THE INVENTION

Therefore, one object of the present invention is to provide a method of cleaning post-etch residues on a copper line which is capable of removing the residues without damaging a copper line.

According to a preferred embodiment of the present invention, a method of cleaning post-etch residues on a copper line includes providing a copper line which is divided into a first region and a second region. Then, a dielectric layer is formed to cover the first region and the second region of the copper line. After that, an etching process is performed on the dielectric layer to form a first number of openings within the first region and a second number of opening within the second region, wherein the first number is larger than the second number. During the etching process, a potential difference is formed between the first region of the copper line and the second region of the copper line. Finally, the dielectric layer and the copper line are cleaned by a solution with a PH value, wherein the relationship between potential difference and the PH value is in accordance with the following mathematical expression:

when $0 \leq X \leq 4.6$ and $0 \leq Y \leq 0.1875$;

when $4.6 < X \leq 8$ and $0 \leq Y \leq 0.4412 - 0.0549X$;

wherein X is the PH value and Y is the potential difference.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 to FIG. 6 depict a method of cleaning post-etch residues on a copper line according to a preferred embodiment of the present invention, wherein:

FIG. 3 depicts a step of providing a copper line and a dielectric layer.

FIG. 4 is a fabricating stage following FIG. 3;

FIG. 5 is a fabricating stage following FIG. 4; and

FIG. 6 is a fabricating stage following FIG. 5.

DETAILED DESCRIPTION

Figure 1:
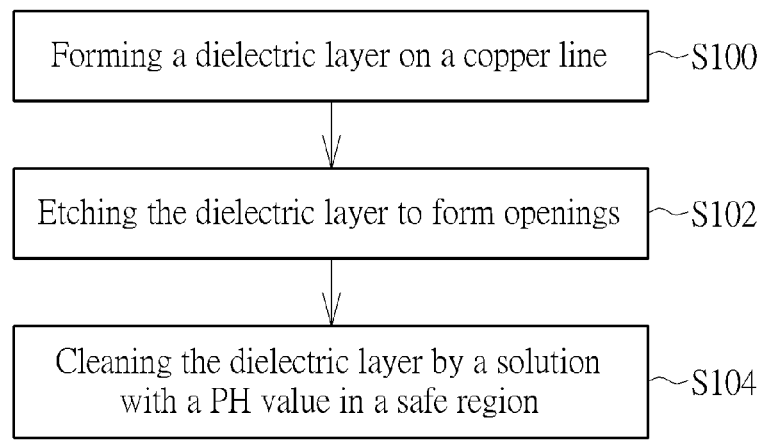
FIG. 1 is a flowchart of a method of cleaning post-etch residues on a copper line in accordance with a preferred embodiment of the present invention.

FIG. 1 is a flowchart of a method of cleaning post-etch residues on a copper line in accordance with a preferred embodiment of the present invention. As shown in FIG. 1, step S100 is carried out. A copper line is formed followed by forming a dielectric layer on the copper line. The copper line is separated into a first region and a second region. Next, step S102 is carried out as shown in FIG. 1. The dielectric layer is etched to form numerous openings therein. The openings includes trenches, vias or a combination thereof. A number of openings directly above the first region is more than a number of openings directly above the second region. During the formation of the openings, some post-etch residues are formed on the copper line and the dielectric layer. When etching the dielectric layer, charges accumulate at the first region of the copper line. Therefore, there is a potential difference between the first region and the second region of the copper line. Step S104 is carried out wherein the copper line and the dielectric layer are cleaned to remove the post-etch residues remaining on the dielectric layer and the copper line. The employed cleaning solution has a specific PH value which is related to the potential difference.

Figure 2:
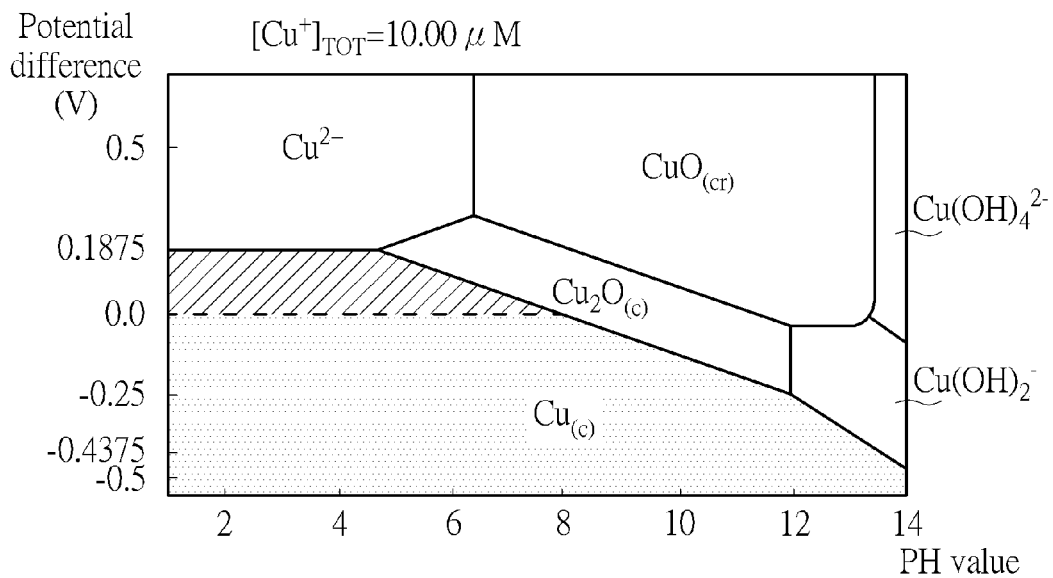
FIG. 2 shows a potential difference-PH diagram for a Cu(II)/Cu(I)/Cu(0) system.

FIG. 2 shows a potential difference-PH diagram for a Cu(II)/Cu(I)/Cu(0) system. In order to avoid corrosion of the copper line, the copper in the copper line should be maintained at Cu(0), which is a metal state. Furthermore, because of the fabricating conditions, the potential difference between the first region and the second region of the copper line is preferably a positive number. Therefore, a safe region is selected which fits the criteria that a potential difference is positive and the copper is in the metal state; the safe region in FIG. 2 is indicated by slashed lines. As a result, the cleaning solution used in the present invention has a PH value which is related to the potential difference. The relation can be expressed by the following mathematical expression:

when $0 \leq X \leq 4.6$ and $0 \leq Y \leq 0.1875$;

when $4.6 < X \leq 8$ and $0 \leq Y \leq 0.4412 - 0.0549X$;

wherein X is the PH value and Y is the potential difference.

The mathematical expression above is for describing the safe region in FIG. 2. The residues on the dielectric layer and the copper are removed by the cleaning solution without corroding the copper line. Later, a copper layer is formed to fill up the openings.

In the following embodiments, numerous specific details are given to provide a thorough understanding of the invention.

Figure 3:
Figure 3:
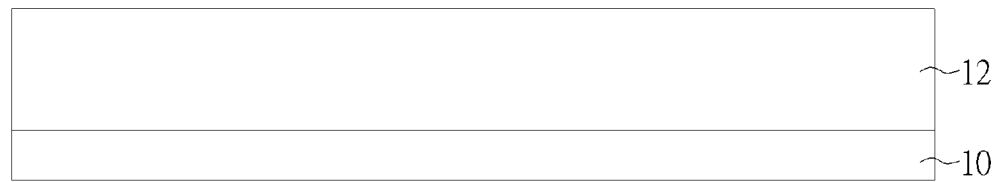

FIG. 3 to FIG. 6 depict a method of cleaning post-etch residues on a copper line according to a preferred embodiment of the present invention. As shown in FIG. 3, a copper line 10 is formed on a substrate (not shown). The substrate may be a dielectric layer, a bulk silicon substrate, a germanium substrate, a gallium arsenide substrate, a silicon germanium substrate, an indium phosphide substrate, a gallium nitride substrate or a silicon carbide substrate. The copper line 10 is divided into a first region A and a second region B. Afterwards, there will be more openings directly on the first region A than on the second region B.

Then, a dielectric layer 12 is formed on the copper line 10, and covers the first region A and the second region B. The dielectric layer 12 may be silicon oxide, silicon nitride, silicon carbide nitride, silicon oxynitride, silicon carboxynitride, low k dielectrics or any combination thereof.

Figure 4:
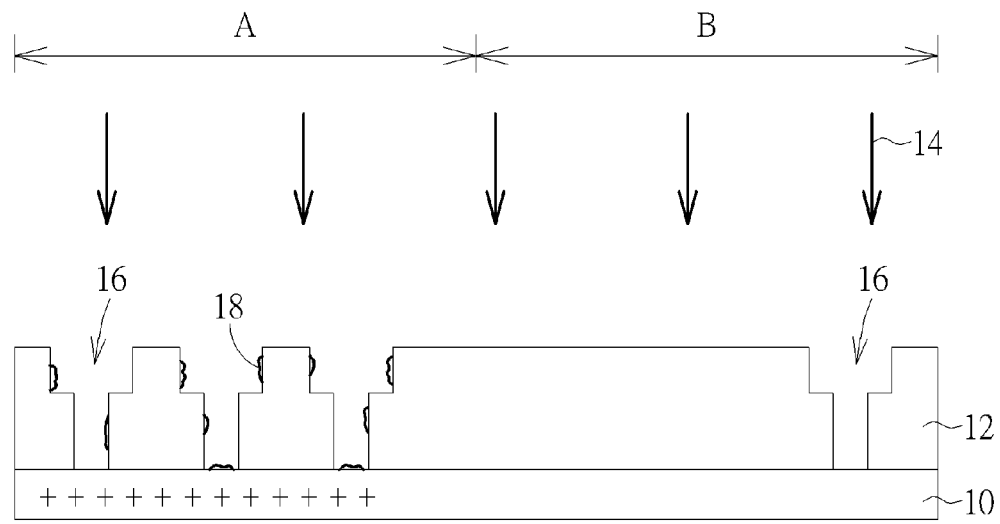

As shown in FIG. 4, an etching process 14 is performed on the dielectric layer 12 to form a first number of openings 16 in the dielectric layer 12 within the first region A and a second number of opening(s) 16 in the dielectric layer 12 within the second region B. The first number is larger than the second number. The smallest number of the second number is one. In this embodiment, the first number is three and the second number is one; however, the first number and the second number can be changed based on difference product requirements.

During the etching process 14, charges accumulate in the first region A of the copper line 10 as there are more openings 16 formed directly above the first region A than above the second region B, and the charges will accumulate at a region having more openings. According to a preferred embodiment of the present invention, the etching process 14 is a dry etching process. Conventionally, the plasma used in the dry etching process 14 includes primarily positive ions. Therefore, the charges accumulated in the first region A are positive. After the openings 16 are formed, a potential difference is formed between the first region A and the second region B of the copper line 10. The potential difference is a potential of the copper line 10 of the first region A deducted from a potential of the copper line 10 of the second region B. Furthermore, post-etch residues 18 are also formed on the dielectric layer 12 and the copper line 10 while etching the dielectric layer 12.

Figure 5:
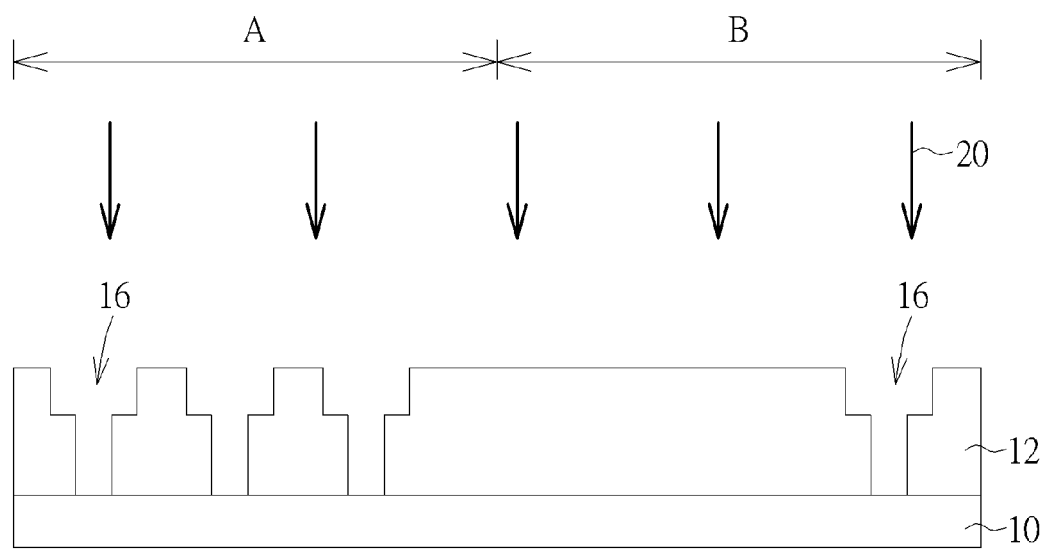

As shown in FIG. 5, a cleaning process 20 is performed. The dielectric layer 12 and the copper line 10 are cleaned by a solution with a PH value. The relationship between the potential difference and the PH value is in accordance with the following mathematical expression:

$$\text{when } 0 \leq X \leq 4.6 \text{ and } 0 \leq Y \leq 0.1875;$$

$$\text{when } 4.6 < X \leq 8 \text{ and } 0 \leq Y \leq 0.4412 - 0.0549X;$$

wherein X is the PH value and Y is the potential difference.

If the potential difference is 0.1 volt, the PH value of the solution can be in a range between 0 and 6. The solution may be a mixture of methyl carbitoll, ammonium fluoride, and deionized water, a mixture of triethanolamine, amine, and organic acid, or a mixture of deionized water, triethanolamine, (N, N, N, N, N)-pentamethyldiethylenetriamine, and ammonium bifluoride. In other cases, the solution may be a mixture of tetrazole, diglycolamine, ammonium fluoride, a mixture of tetrazole, copper corrosion inhibit and gallic acid, or a mixture of monoethanolamine and fluoride.

After the dielectric layer 12 and the copper line 10 are cleaned by the solution, the post-etch residues 18 are removed and the copper line 10 is not oxidized or corroded.

Figure 6:
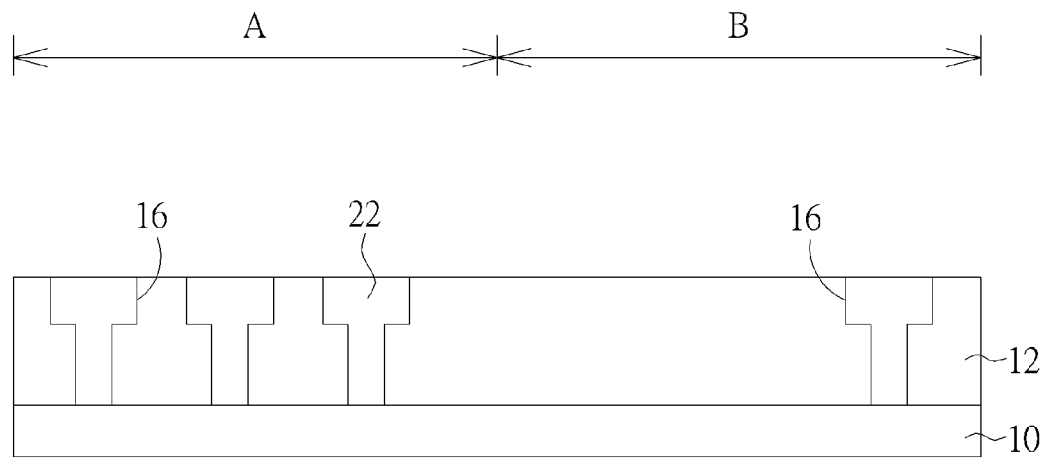

As shown in FIG. 6, a copper layer 22 is formed to fill the openings 16 in the first region A and the second region B. The copper layer 22 in the openings serves as contact plugs of the present invention.

According to another preferred embodiment of the present invention, the potential difference may be negative if the copper line 10 couples to a voltage controller (not shown). In this case, a safe region for negative potential difference (indicated by dotted lines) will be formed in copper in a metal state which has a negative potential difference, as shown in FIG. 2.

In this embodiment, the relationship between potential difference and the PH value is in accordance with the following mathematical expression:

$$\text{when } 0 \leq X \leq 8 \text{ and } Y \leq 0;$$

$$\text{when } 8 < X \leq 12 \text{ and } Y \leq 0.4412 - 0.0549X;$$

$$\text{when } 12 < X \leq 14 \text{ and } Y \leq 0.875 - 0.09375X;$$

wherein X is the PH value and Y is the potential difference.

By applying the potential difference-PH diagram of copper to the method of cleaning post-etch residues, the PH value of the cleaning solution can be predicted accurately to avoid corrosion of the copper line. The number of routine trial-and-error approaches to find the adequate PH value can thereby be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of cleaning post-etch residues on a copper line, comprising:
   providing a copper line which is divided into a first region and a second region;
   forming a dielectric layer covering the first region and the second region of the copper line;
   performing an etching process on the dielectric layer to form a first number of openings in the dielectric layer directly above the first region and a second number of opening (s) in the dielectric layer directly above the second region, wherein the first number is larger than the second number, wherein, during the etching process, a potential difference is formed between the first region of the copper line and the second region of the copper line; and
   cleaning the dielectric layer and the copper line with a solution with a PH value, wherein the relationship between the potential difference and the PH value is in accordance with the following mathematical expression:

$$\text{when } 0 \leq X \leq 4.6 \text{ and } 0 \leq Y \leq 0.1875;$$

$$\text{when } 4.6 < X \leq 8 \text{ and } 0 \leq Y \leq 0.4412 - 0.0549X;$$

wherein X is the PH value and Y is the potential difference.

2. The method of cleaning post-etch residues on a copper line of claim 1, further comprising:
   forming a copper layer filling in the openings in the first region and the second region.

3. The method of cleaning post-etch residues on a copper line of claim 1, wherein the potential difference is a potential of the copper line of the first region deducted from a potential of the copper line of the second region.

4. The method of cleaning post-etch residues on a copper line of claim 1, wherein during the etching process, the copper line of the first region accumulates more positive charges than the copper line of the second region.

* * * * *